United States Patent
Chen et al.

(10) Patent No.: US 11,934,254 B2
(45) Date of Patent: Mar. 19, 2024

(54) MEMORY DEVICE WITH EMBEDDED FIRMWARE REPAIRING MECHANISM

(71) Applicant: YANGTZE MEMORY TECHNOLOGIES CO., LTD., Wuhan (CN)

(72) Inventors: Zhuo Chen, Wuhan (CN); Yue Sheng, Wuhan (CN)

(73) Assignee: YANGTZE MEMORY TECHNOLOGIES CO., LTD., Wuhan (CN)

(*) Notice: Subject to any disclaimer, the term of this patent is extended or adjusted under 35 U.S.C. 154(b) by 269 days.

(21) Appl. No.: 17/334,090

(22) Filed: May 28, 2021

(65) Prior Publication Data
US 2022/0319611 A1   Oct. 6, 2022

Related U.S. Application Data

(63) Continuation of application No. PCT/CN2021/083816, filed on Mar. 30, 2021.

(51) Int. Cl.
*G06F 11/00*    (2006.01)
*G06F 8/65*     (2018.01)
(Continued)

(52) U.S. Cl.
CPC ............ *G06F 11/0727* (2013.01); *G06F 8/65* (2013.01); *G06F 11/2094* (2013.01);
(Continued)

(58) Field of Classification Search
CPC ............ G06F 11/0727; G06F 11/2094; G06F 11/2284; G06F 11/1417; G06F 2201/85; G06F 8/65; G11C 16/0483; G11C 16/20
See application file for complete search history.

(56) References Cited

U.S. PATENT DOCUMENTS

| 6,201,733 | B1 | 3/2001 | Hiraki et al. |
| 7,043,664 | B1* | 5/2006 | Chiloyan ............ G06F 11/1417 |
|  |  |  | 714/E11.133 |
| 9,934,045 | B1 | 4/2018 | Manlapat et al. |

(Continued)

FOREIGN PATENT DOCUMENTS

| CN | 103578554 A | 2/2014 |
| CN | 106164860 A | 11/2016 |

(Continued)

OTHER PUBLICATIONS

International Search Report issued in corresponding International Application No. PCT/CN2021/083816, dated Dec. 20, 2021, 4 pages.

*Primary Examiner* — Joseph D Manoskey
(74) *Attorney, Agent, or Firm* — BAYES PLLC

(57) ABSTRACT

In certain aspects, a memory device includes a non-volatile memory storing firmware, a control logic coupled to the non-volatile memory, and an array of memory cells coupled to the control logic, the array of memory cells is embedded with instructions that are executable by the control logic. The control logic is configured to perform a power-on reset (POR) initialization operation to control an initialization of the memory device based on the firmware, repair the firmware based on execution of the instructions embedded on the array of memory cells, and perform a remaining POR initialization operation based on the repaired firmware.

20 Claims, 6 Drawing Sheets

(51) Int. Cl.
 *G06F 11/07* (2006.01)
 *G06F 11/20* (2006.01)
 *G06F 11/22* (2006.01)
 *G11C 16/04* (2006.01)
 *G11C 16/20* (2006.01)
(52) U.S. Cl.
 CPC ...... *G06F 11/2284* (2013.01); *G11C 16/0483* (2013.01); *G11C 16/20* (2013.01); *G06F 2201/85* (2013.01)

(56) References Cited

U.S. PATENT DOCUMENTS

| | | | | |
|---|---|---|---|---|
| 2003/0088868 | A1* | 5/2003 | Chang | G06F 8/65 717/173 |
| 2007/0088940 | A1* | 4/2007 | M. Conley | G11C 16/20 713/1 |
| 2009/0040825 | A1* | 2/2009 | Adusumilli | G11C 29/846 365/185.09 |
| 2012/0182803 | A1* | 7/2012 | Shirakawa | G11C 29/025 365/185.11 |
| 2019/0065751 | A1* | 2/2019 | Srinivas | G06F 21/575 |
| 2019/0131972 | A1* | 5/2019 | Gans | H03K 19/018585 |
| 2019/0179573 | A1* | 6/2019 | Hsu | G06F 9/3879 |
| 2020/0089410 | A1* | 3/2020 | Park | G06F 3/065 |
| 2021/0240371 | A1* | 8/2021 | Rajagopalan | G06F 3/0653 |
| 2021/0357204 | A1* | 11/2021 | Nachimuthu | G06F 8/656 |

FOREIGN PATENT DOCUMENTS

| | | |
|---|---|---|
| CN | 109240729 A | 1/2019 |
| CN | 110088731 A | 8/2019 |
| CN | 110347534 A | 10/2019 |
| CN | 111433750 A | 7/2020 |
| JP | 2003016795 A | 1/2003 |

\* cited by examiner

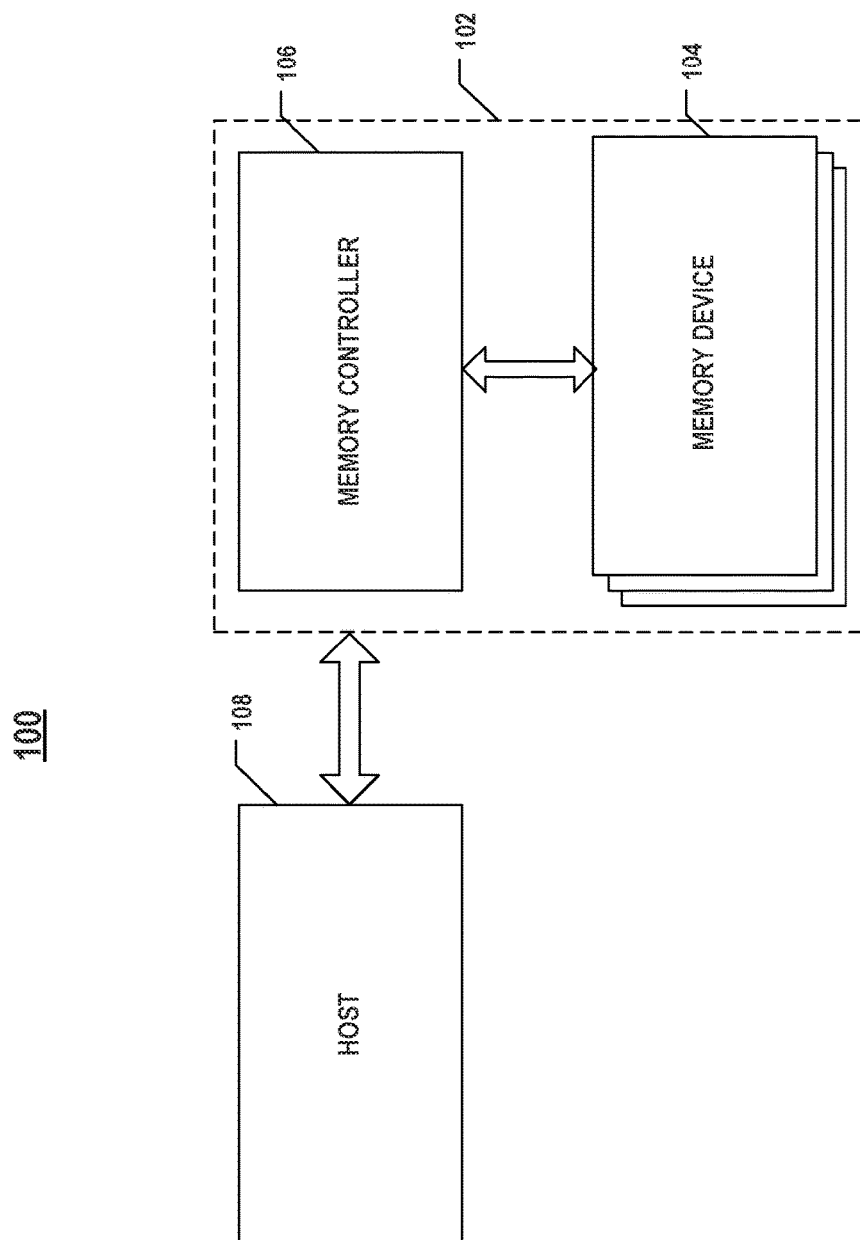

MEMORY DEVICE WITH EMBEDDED FIRMWARE REPAIRING MECHANISM

CROSS-REFERENCE TO RELATED APPLICATIONS

This application is continuation of International Application No. PCT/CN2021/083816, filed on Mar. 30, 2021, entitled "MEMORY DEVICE WITH EMBEDDED FIRMWARE REPAIRING MECHANISM," which is hereby incorporated by reference in its entirety.

BACKGROUND

The present disclosure relates to memory devices and operation methods thereof.

Flash memory is a low-cost, high-density, non-volatile solid-state storage medium that can be electrically erased and reprogrammed. Flash memory includes NOR Flash memory or NAND Flash memory. When a Flash memory device is powered on, certain initialization operations are carried out before regular data reading/writing can be performed. Such initialization operations are often performed by executing instructions stored as firmware on a read-only memory (ROM) device. Conventional Flash memory devices lack the ability to repair faulty firmware during the power-on process. As a result, if the firmware contains bugs, such bugs cannot be properly mitigated or corrected, causing failure of the Flash memory devices.

SUMMARY

In one aspect, a memory device includes a non-volatile memory storing firmware, a control logic coupled to the non-volatile memory, and an array of memory cells coupled to the control logic, the array of memory cells is embedded with instructions that are executable by the control logic. The control logic is configured to perform a power-on reset (POR) initialization operation to control an initialization of the memory device based on the firmware, repair the firmware based on execution of the instructions embedded on the array of memory cells, and perform a remaining POR initialization operation based on the repaired firmware.

In another aspect, a system includes a memory device configured to store data and a memory controller coupled to the memory device and configured to control the memory device. The memory device includes a non-volatile memory storing firmware, a control logic coupled to the non-volatile memory, and an array of memory cells coupled to the control logic, the array of memory cells is embedded with instructions that are executable by the control logic. The control logic is configured to perform a power-on reset (POR) initialization operation to control an initialization of the memory device based on the firmware, repair the firmware based on execution of the instructions embedded on the array of memory cells, and perform a remaining POR initialization operation based on the repaired firmware.

In still another aspect, a method for initializing a memory device is provided. The memory device includes a non-volatile memory storing firmware, a control logic coupled to the non-volatile memory, and an array of memory cells coupled to the control logic and embedded with instructions for repairing the firmware. The method includes performing, by the control logic, a power-on reset (POR) initialization operation; repairing, by the control logic, the firmware based on execution of the instructions embedded on the array of memory cells; and performing, by the control logic, a remaining POR initialization operation based on the repaired firmware.

BRIEF DESCRIPTION OF THE DRAWINGS

The accompanying drawings, which are incorporated herein and form a part of the specification, illustrate aspects of the present disclosure and, together with the description, further serve to explain the principles of the present disclosure and to enable a person skilled in the pertinent art to make and use the present disclosure.

FIG. 1 illustrates a block diagram of an exemplary system having a memory device, according to some aspects of the present disclosure.

Figure 2A:
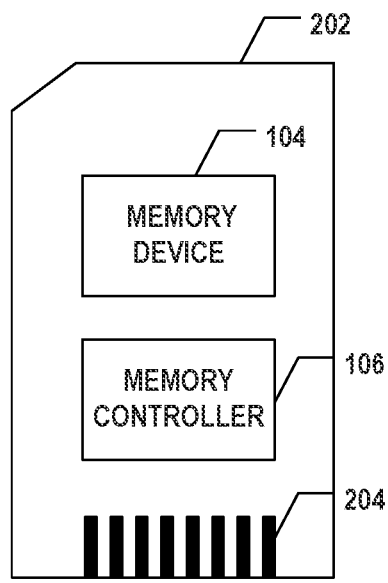
FIG. 2A illustrates a diagram of an exemplary memory card having a memory device, according to some aspects of the present disclosure.

The present disclosure will be described with reference to the accompanying drawings.

DETAILED DESCRIPTION

Although specific configurations and arrangements are discussed, it should be understood that this is done for illustrative purposes only. As such, other configurations and arrangements can be used without departing from the scope of the present disclosure. Also, the present disclosure can also be employed in a variety of other applications. Functional and structural features as described in the present disclosures can be combined, adjusted, and modified with one another and in ways not specifically depicted in the drawings, such that these combinations, adjustments, and modifications are within the scope of the present disclosure.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

The number of Flash memory devices, such as NOR Flash memories or NAND Flash memories, proliferated in recent years due to their low cost and high capacity. A Flash memory is non-volatile, retaining data even without power. When power is applied, an initialization process is carried out before regular data reading/writing operations can be performed. The initialization process is often performed by a data processing device by executing initialization instructions stored as firmware on a read-only memory (ROM) device, including non-volatile memories such as erasable programmable read-only memories (EPROMs) and electrically erasable programmable read-only memories (EEPROMs). Such firmware initialization instructions, however, may not be optimized or may contain bugs or other forms of imperfections, which, if left unrepaired, can cause the failure of the initialization process or even failure of the Flash memory device.

Conventional Flash memories lack the ability to repair firmware during the initialization process. As a result, the design of the firmware needs to be carried out with greater efforts, or the firmware needs to be kept lightweight to maintain the robustness of the initialization process. Certain firmware repairing mechanisms may be used to remedy this issue to some extent, but they are typically enabled at the end of the initialization process. Therefore, firmware bugs that occurred in the early phase of the initialization process cannot be repaired.

To address one or more of the aforementioned issues, the present disclosure introduces an embedded firmware repairing mechanism, referred to as eREM, in which firmware repairing instructions are embedded in memory cells and executed by a memory control logic in an early phase of the initialize process to repair various forms of firmware defects. For example, the eREM can be enabled before register initialization, internal ZQ calibration, and/or temperature sensor initialization. In this way, firmware defects in operations after the execution of the eREM can be repaired, alleviating the stringent requirements imposed on the firmware. Firmware codes can be made more flexible.

As used herein, firmware refers to a software program or set of instructions programmed on a non-volatile memory, such as a ROM device (e.g., EPROM, EEPROM, etc.). In some embodiments, the ROM device may be part of the peripheral devices of a Flash memory device. The eREM may be in the form of a software program of a set of instructions programmed on an array of memory cells of the Flash memory device. For example, the eREM may be embedded on the array of the memory cells (e.g., in certain locations or in certain forms) such that contents of the eREM can be found during a power-on reset (POR) initialization process. The array of memory cells may form the main storage medium of the Flash memory device. The POR initialization process may be carried out by a data processing device, which may be part of the peripheral devices of the Flash memory device, by executing the firmware. During the execution of the POR initialization process, the data processing device may access the array of memory cells to load and execute firmware repairing instructions of the eREM to repair the firmware.

FIG. 1 illustrates a block diagram of an exemplary system 100 having a memory device, according to some aspects of the present disclosure. System 100 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. As shown in FIG. 1, system 100 can include a host 108 and a memory system 102 having one or more memory devices 104 and a memory controller 106. Host 108 can be a processor of an electronic device, such as a central processing unit (CPU), or a system-on-chip (SoC), such as an application processor (AP). Host 108 can be configured to send or receive data to or from memory devices 104.

Memory device 104 can be any memory device disclosed in the present disclosure. As disclosed below in detail, memory device 104, such as NAND Flash memory device, can include an eREM that is configured to repair firmware during the POR initialization process.

Memory controller 106 is coupled to memory device 104 and host 108 and is configured to control memory device 104, according to some implementations. Memory controller 106 can manage the data stored in memory device 104 and communicate with host 108. In some implementations, memory controller 106 is designed for operating in a low duty-cycle environment like secure digital (SD) cards, compact Flash (CF) cards, universal serial bus (USB) Flash drives, or other media for use in electronic devices, such as personal computers, digital cameras, mobile phones, etc. In some implementations, memory controller 106 is designed for operating in a high duty-cycle environment SSDs or embedded multi-media-cards (eMMCs) used as data storage for mobile devices, such as smartphones, tablets, laptop computers, etc., and enterprise storage arrays. Memory controller 106 can be configured to control operations of memory device 104, such as read, erase, and program operations. Memory controller 106 can also be configured to manage various functions with respect to the data stored or to be stored in memory device 104 including, but not limited to bad-block management, garbage collection, logical-to-physical address conversion, wear leveling, etc. In some implementations, memory controller 106 is further configured to process error correction codes (ECCs) with respect to the data read from or written to memory device 104. Any other suitable functions may be performed by memory controller 106 as well, for example, formatting memory device 104. Memory controller 106 can communicate with an external device (e.g., host 108) according to a particular communication protocol. For example, memory controller 106 may communicate with the external device through at least one of various interface protocols, such as a USB protocol, an MMC protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

Figure 2B:
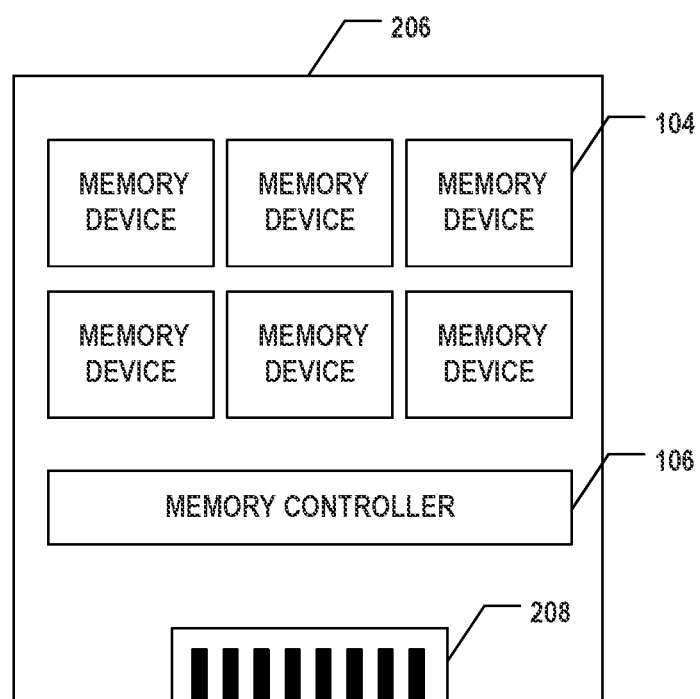
FIG. 2B illustrates a diagram of an exemplary solid-state drive (SSD) having a memory device, according to some aspects of the present disclosure.

Memory controller 106 and one or more memory devices 104 can be integrated into various types of storage devices, for example, be included in the same package, such as a universal Flash storage (UFS) package or an eMMC package. That is, memory system 102 can be implemented and packaged into different types of end electronic products. In one example as shown in FIG. 2A, memory controller 106 and a single memory device 104 may be integrated into a memory card 202. Memory card 202 can include a PC card (PCMCIA, personal computer memory card international association), a CF card, a smart media (SM) card, a memory stick, a multimedia card (MMC, RS-MMC, MMCmicro), an SD card (SD, miniSD, microSD, SDHC), a UFS, etc. Memory card 202 can further include a memory card connector 204 coupling memory card 202 with a host (e.g., host 108 in FIG. 1). In another example as shown in FIG. 2B, memory controller 106 and multiple memory devices 104 may be integrated into an SSD 206. SSD 206 can further include an SSD connector 208 coupling SSD 206 with a host (e.g., host 108 in FIG. 1). In some implementations, the storage capacity and/or the operation speed of SSD 206 is greater than those of memory card 202.

Figure 3:
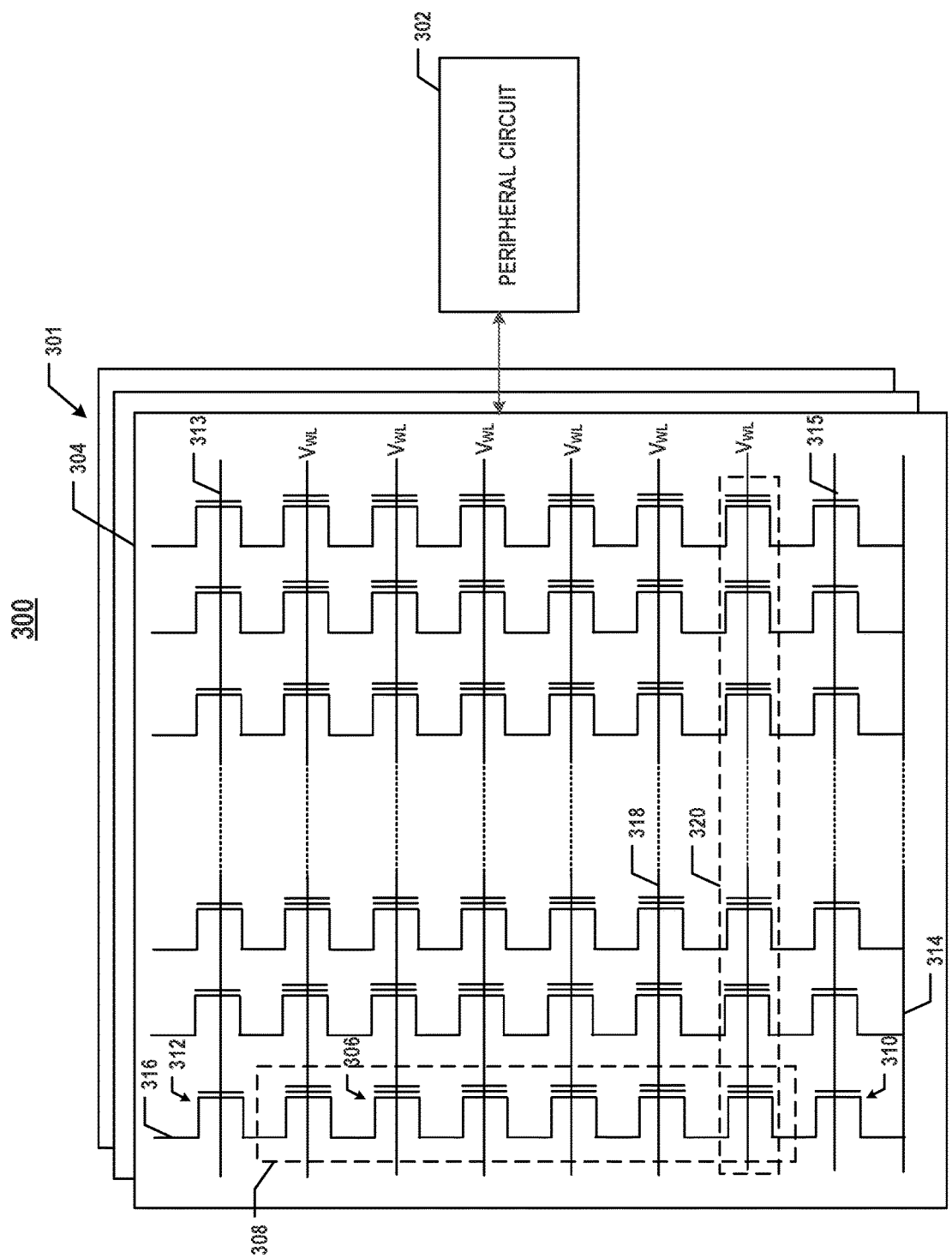
FIG. 3 illustrates a schematic diagram of an exemplary memory device including peripheral circuits, according to some aspects of the present disclosure.

FIG. 3 illustrates a schematic circuit diagram of an exemplary memory device 300 including peripheral circuits, according to some aspects of the present disclosure. Memory device 300 can be an example of memory device 104 in FIG. 1. Memory device 300 can include a memory cell array 301 and peripheral circuits 302 coupled to memory cell array 301. Memory cell array 301 can be a NAND Flash memory cell array in which memory cells 306 are provided in the form of an array of NAND memory strings 308 each extending vertically above a substrate (not shown). In some implementations, each NAND memory string 308 includes a plurality of memory cells 306 coupled in series and stacked vertically. Each memory cell 306 can hold a continuous, analog value, such as an electrical voltage or charge, that depends on the number of electrons trapped within a region of memory cell 306. Each memory cell 306 can be either a floating gate type of memory cell including a floating-gate transistor or a charge trap type of memory cell including a charge-trap transistor.

In some implementations, each memory cell 306 is a single-level cell (SLC) that has two possible memory states and thus, can store one bit of data. For example, the first memory state "0" can correspond to a first range of voltages, and the second memory state "1" can correspond to a second range of voltages. In some implementations, each memory cell 306 is a multi-level cell (MLC) that is capable of storing more than a single bit of data in more than four memory states. For example, the MLC can store two bits per cell, three bits per cell (also known as triple-level cell (TLC)), or four bits per cell (also known as a quad-level cell (QLC)). Each MLC can be programmed to assume a range of possible nominal storage values. In one example, if each MLC stores two bits of data, then the MLC can be programmed to assume one of three possible programming levels from an erased state by writing one of three possible nominal storage values to the cell. A fourth nominal storage value can be used for the erased state.

As shown in FIG. 3 each NAND memory string 308 can include a source select gate (SSG) transistor 310 at its source end and a drain select gate (DSG) transistor 312 at its drain end. SSG transistor 310 and DSG transistor 312 can be configured to activate selected NAND memory strings 308 (columns of the array) during read and program operations. In some implementations, SSG transistors 310 of NAND memory strings 308 in the same block 304 are coupled through a same source line (SL) 314, e.g., a common SL, for example, to the ground. DSG transistor 312 of each NAND memory string 308 is coupled to a respective bit line 316 from which data can be read or written via an output bus (not shown), according to some implementations. In some implementations, each NAND memory string 308 is configured to be selected or deselected by applying a select voltage (e.g., above the threshold voltage of DSG transistor 312) or a deselect voltage (e.g., 0 V) to the gate of respective transistor DSG 312 through one or more DSG lines 313 and/or by applying a select voltage (e.g., above the threshold voltage of SSG transistor 310) or a deselect voltage (e.g., 0 V) to the gate of respective SSG transistor 310 through one or more SSG lines 315.

As shown in FIG. 3, NAND memory strings 308 can be organized into multiple blocks 304, each of which can have a common source line 314. In some implementations, each block 304 is the basic data unit for erase operations, i.e., all memory cells 306 on the same block 304 are erased at the same time. Memory cells 306 of adjacent NAND memory strings 308 can be coupled through word lines 318 that select which row of memory cells 306 is affected by read and program operations. In some implementations, each word line 318 is coupled to a page 320 of memory cells 306, which is the basic data unit for program operations. The size of one page 320 in bits can relate to the number of NAND memory strings 308 coupled by word line 318 in one block 304. Each word line 318 can include a plurality of control gates (gate electrodes) at each memory cell 306 in respective page 320 and a gate line coupling the control gates.

In some embodiments, firmware repairing instructions may be embedded on certain locations of memory cell array 301. For example, firmware repairing instructions may be stored on one or more blocks 304 etc. In some embodiments, the location of the firmware repairing instructions may be stored in register(s) (e.g., registers 414 in FIG. 4), on the ROM that stores the firmware, or any other suitable places that are accessible during the POR initialization process. In some embodiments, the location of the firmware repairing instructions may be updated dynamically depending on the health of the blocks, columns, and/or rows of memory cell array 301.

Figure 4:
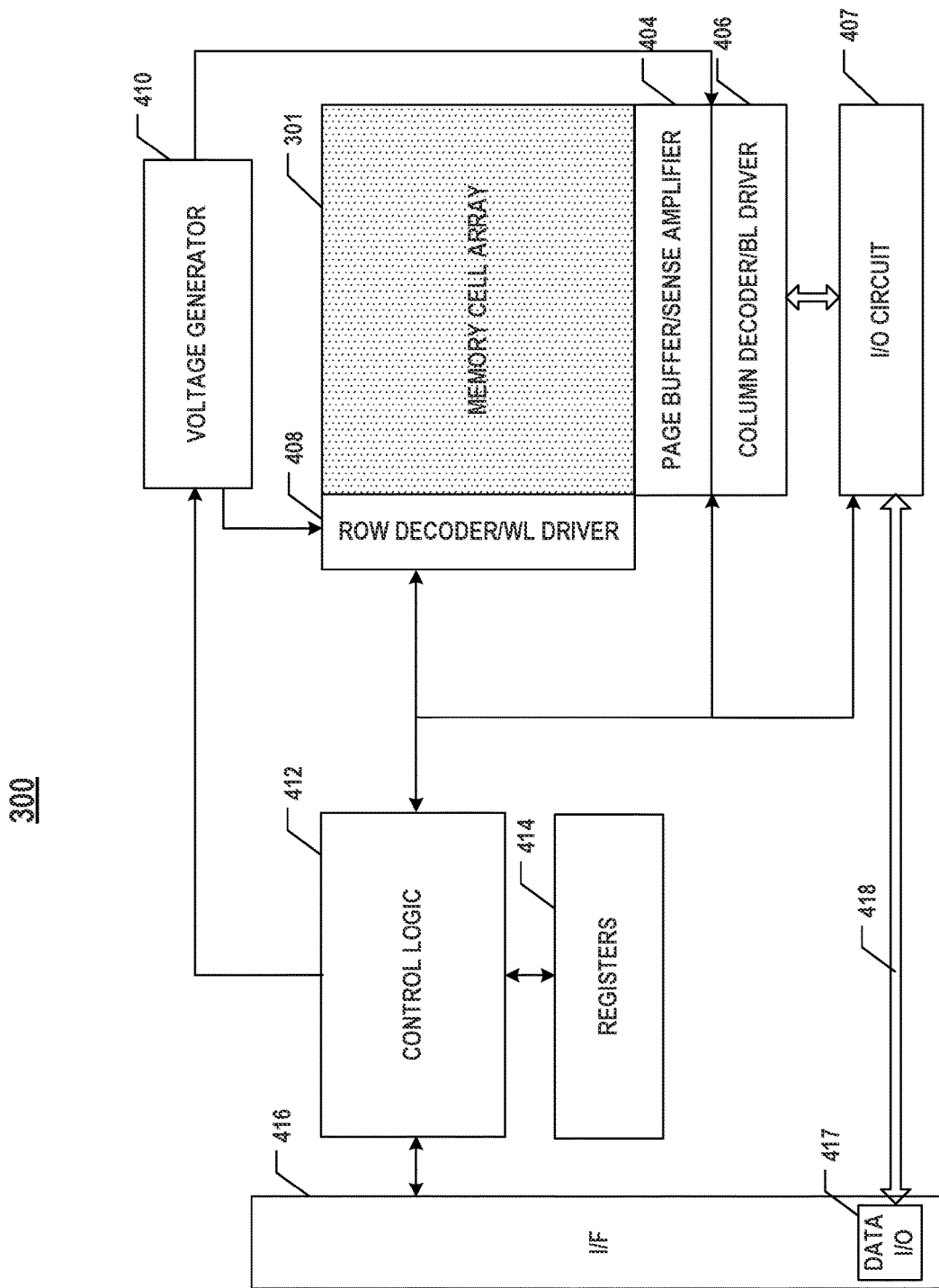
FIG. 4 illustrates a block diagram of an exemplary memory device including a memory cell array and peripheral circuits, according to some aspects of the present disclosure.

Peripheral circuits 302 can be coupled to memory cell array 301 through bit lines 316, word lines 318, source lines 314, SSG lines 315, and DSG lines 313. Peripheral circuits 302 can include any suitable analog, digital, and mixed-signal circuits for facilitating the operations of memory cell array 301 by applying and sensing voltage signals and/or current signals to and from each target memory cell 306 through bit lines 316, word lines 318, source lines 314, SSG lines 315, and DSG lines 313. Peripheral circuits 302 can include various types of peripheral circuits formed using metal-oxide-semiconductor (MOS) technologies. For example, FIG. 4 illustrates some exemplary peripheral circuits 302 including a page buffer/sense amplifier 404, a column decoder/bit line driver 406, an I/O circuit 407, a row decoder/word line driver 408, a voltage generator 410, control logic 412, registers 414, an interface 416, and a data bus 418. It is understood that in some examples, additional peripheral circuits not shown in FIG. 4 may be included as well.

Page buffer/sense amplifier 404 can be configured to read and program (write) data from and to memory cell array 301 according to the control signals from control logic 412. In one example, page buffer/sense amplifier 404 may store one page of program data (write data) to be programmed into one page 320 of memory cell array 301. In another example, page buffer/sense amplifier 404 may perform program verify operations to ensure that the data has been properly programmed into memory cells 306 coupled to selected word lines 318. In still another example, page buffer/sense amplifier 404 may also sense the low power signals from bit line 316 that represents a data bit stored in memory cell 306 and amplify the small voltage swing to recognizable logic levels in read operation.

Column decoder/bit line driver 406 can be configured to be controlled by control logic 412 and select one or more NAND memory strings 308 by applying bit line voltages generated from voltage generator 410. I/O circuit 407 can be coupled to page buffer/sense amplifier 404 and/or column decoder/bit line driver 406 and configured to direct (route) the data input from data bus 418 to the desired memory cell areas (e.g., banks) of memory cell array 301, as well as the data output from the desired memory cell areas to data bus 418.

Row decoder/word line driver 408 can be configured to be controlled by control logic 412 and select block 304 of memory cell array 301 and a word line 318 of selected block 304. Row decoder/word line driver 408 can be further configured to drive the selected word line 318 using a word line voltage generated from voltage generator 410. Voltage generator 410 can be configured to be controlled by control logic 412 and generate the word line voltages (e.g., read voltage, program voltage, pass voltage, local voltage, and verification voltage) to be supplied to memory cell array 301.

Control logic 412 can be coupled to each peripheral circuit described above and configured to control the operations of each peripheral circuit. Registers 414 can be coupled to control logic 412 and include status registers, command registers, and address registers for storing status information, command operation codes (OP codes), and command addresses for controlling the operations of each peripheral circuit. For example, registers 414 may store address(es) of the firmware repairing instructions of the eREM such that control logic can access the firmware repairing instructions during the POR initialization process. Interface 416 can be coupled to control logic 412 and act as a control buffer to buffer and relay control commands received from a host (not shown) to control logic 412 and status information received from control logic 412 to the host. Interface 416 can also be coupled to I/O circuit 407 via data bus 418 and act as a data I/O interface and a data buffer to buffer and relay the write data received from a host (not shown) to I/O circuit 407 and the read data from I/O circuit 407 to the host. For example, interface 416 may include a data I/O 417 coupled to data bus 418.

Figure 5:
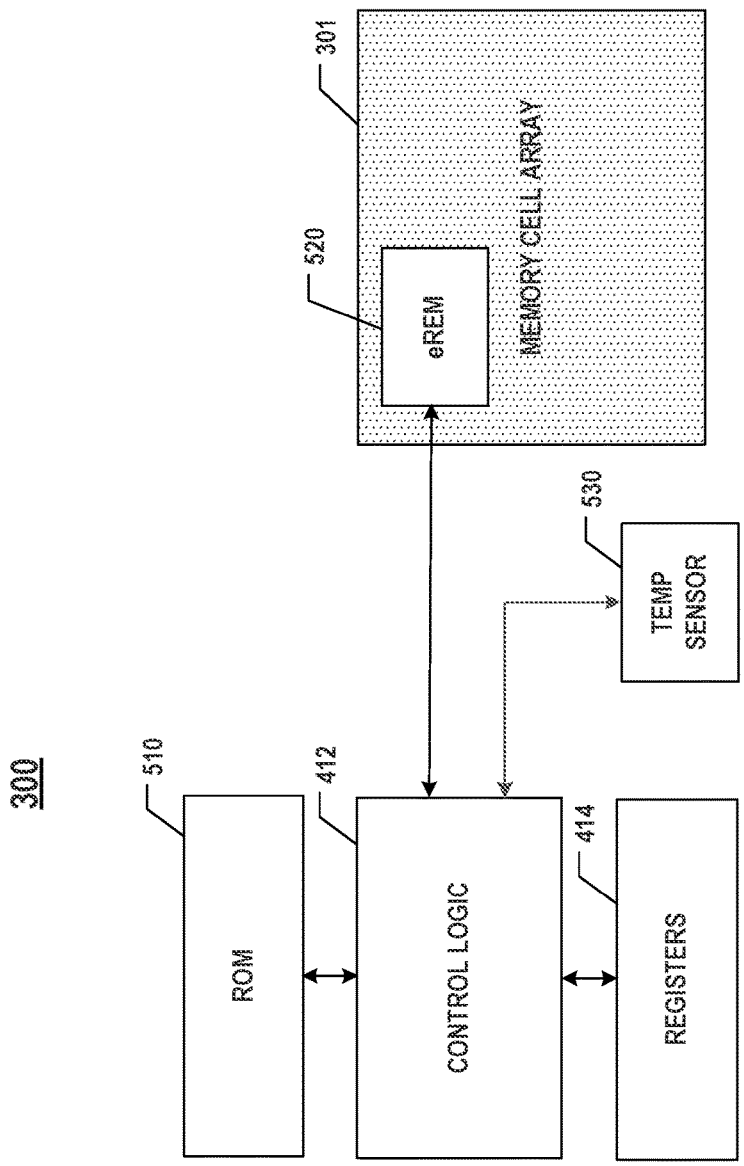
FIG. 5 illustrates a block diagram of an exemplary memory device that implements a firmware repairing mechanism, according to some aspects of the present disclosure.

FIG. 5 illustrates exemplary components for implementing the eREM for repairing firmware during the POR initialization process, according to embodiments of the disclosure. As shown in FIG. 5, a non-volatile memory 510 (e.g., a ROM device, hereinafter referred to as ROM 510) may store firmware facilitating the POR initialization process. Control logic 412 may be coupled to ROM 510 and execute the firmware to initialize memory device 300. An eREM 520 may be embedded on memory cell array 301. eREM 520 may include firmware repairing instructions that can be accessed by control logic 412 during the POR initialization process. For example, the addresses of eREM 520 may be stored in register 414, ROM 510, or other suitable non-volatile memory. During the POR initialization process, control logic 412 may read the address of eREM 520 from register 414, ROM 510, etc., locate eREM 520 on memory cell array 301, and load the firmware repairing instructions from eREM 520 for execution.

In some implementations, memory device 300 may include a temperature sensor 530 for sensing the temperature of memory device 300. It is noted that temperature sensor 530, other similar on-die sensors, and ROM 510 may be part of peripheral circuit 302. Temperature sensor 530 and other similar on-die sensors may be initialized during the POR initialization process. For example, the firmware stored in ROM 510 may include codes for initializing temperature sensor 530 and other similar sensors. With the implementation of eREM 520, initialization of temperature sensor 530 and other similar sensors may be carried out after executing the firmware repairing instructions of the eREM 520. In this way, bugs and/or defects in the firmware with respect to the initialization of temperature sensor 530 and other similar sensors may be repaired prior to initializing temperature sensor 530 and other similar sensors. Other POR initialization operations that can be benefited from the repaired firmware include, for example, a register initialization operation to initialize registers 414, an internal ZQ calibration operation, etc.

In some embodiments, control logic 412 may access memory cell array 301 during the POR initialization process and locate eREM 520. The firmware repairing instructions of eREM 520 can then be transferred to control logic 412. After control logic 412 receives the firmware repairing instructions, control logic 412 may execute the firmware repairing instructions to implement various firmware repairing functions.

For example, control logic 412 may execute the firmware repairing instructions to generate optimized firmware codes. Firmware codes initially stored in ROM 510 may be standardized across multiple memory devices. However, individual memory devices may differ due to imperfections during chip fabrication processes, the operational environment, etc. It is difficult for the standard firmware to properly handle such variations. Firmware repairing instructions of eREM 520 may optimize the firmware codes according to characteristics of individual memory devices to mitigate this problem. Optimization of firmware codes may also include correcting imperfections in the original firmware. For example, bugs and/or defects in the original firmware stored in ROM 510 may cause the failure of certain operations during the POR initialization process. The firmware repairing instructions of eREM 520 provide a safeguard against such bugs/defects.

In some embodiments, control logic 412 may repair the firmware stored in ROM 510 by updating at least a portion of the firmware using the optimized firmware codes. For example, control logic 412 may add a new segment of codes to the firmware, delete an existing segment of codes from the firmware, and/or replace one or more segments of codes in the firmware with a different segment. For example, control logic 412 may activate the programming mode of ROM 510 to change the firmware stored in ROM 510. In some embodiments, a new version of the firmware may be stored in ROM 510 whenever a repairing operation is performed.

In some embodiments, certain operations of the POR initialization process may be performed prior to enabling eREM 520 (e.g., accessing and subsequently executing the firmware repairing instructions of eREM 520). For example, a bad block reset operation may be performed prior to enabling eREM 520. In another example, a bad column repair operation may be performed prior to enabling eREM 520. It is understood that the type and number of operations performed prior to enabling eREM 520 may vary in different examples. In general, it may be beneficial to enable eREM 520 in an early stage of the POR initialization process to provide firmware repairing functionality to subsequent POR initialization operations.

Control logic 412 can be implemented by microprocessors, microcontrollers (a.k.a. microcontroller units (MCUs)), digital signal processors (DSPs), application-specific integrated circuits (ASICs), field-programmable gate arrays (FPGAs), programmable logic devices (PLDs), state machines, gated logic, discrete hardware circuits, and other suitable hardware, firmware, and/or software configured to perform the various functions described below in detail. In some implementations, one or more of the functionalities of control logic 412 described above can be implemented with content-addressable memory (CAM).

Figure 6:
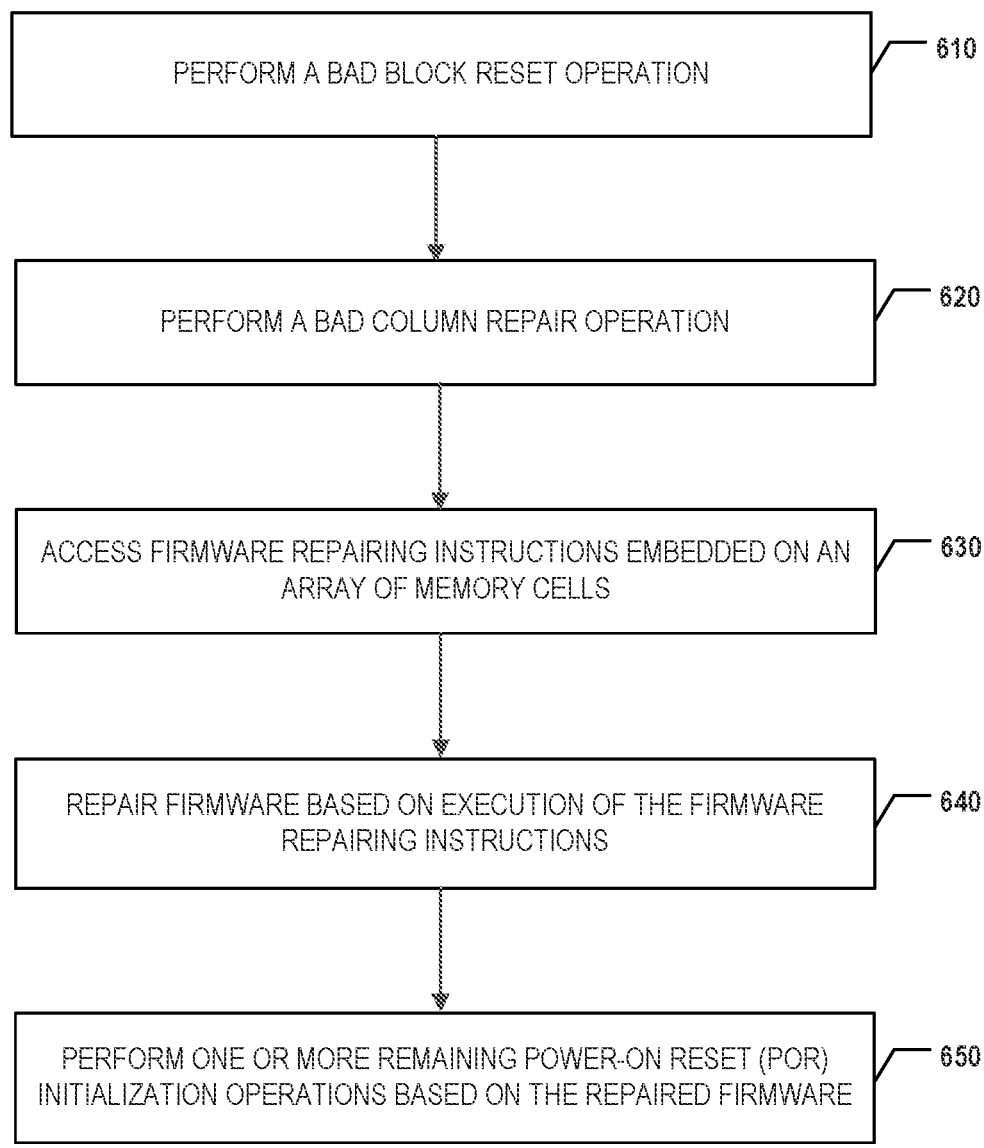
FIG. 6 illustrates a flowchart of an exemplary method for initializing a memory device having a firmware repairing mechanism, according to some aspects of the present disclosure.

FIG. 6 illustrates a flowchart of an exemplary method 600 for initializing a memory device having a firmware repairing mechanism, according to some aspects of the present disclosure. The memory device may be any suitable memory device disclosed herein. Method 600 may be implemented by control logic 412. It is understood that the operations shown in method 600 may not be exhaustive and that other operations can be performed as well before, after, or between any of the illustrated operations. Further, some of the operations may be performed simultaneously, or in a different order than shown in FIG. 6.

Referring to FIG. 6, method 600 starts at operation 610, in which control logic 412 may perform a bad block reset operation to reset bad block flags. The bad block reset operation may be one of the POR initialization operations performed by control logic 412 during the POR initialization process.

At operation 620, control logic 412 may perform a bad column repair operation to repair bad column(s). The bad column repair operation may be one of the POR initialization operations performed by control logic 412 during the POR initialization process.

At operation 630, control logic 412 may access firmware repairing instructions embedded on an array of memory cells (e.g., memory cell array 301). For example, control logic 412 may access eREM 520 and receive firmware repairing instructions of eREM 520 for execution.

At operation 640, control logic 412 may repair firmware (e.g., the firmware stored in ROM 510) based on the execution of the firmware repairing instructions. For example, after receiving the firmware repairing instructions, control logic 412 may execute the firmware repairing instructions to generate optimized firmware codes and update at least a portion of the firmware using the optimized firmware codes, as described above in connection with FIG. 5.

At operation 650, control logic 412 may perform one or more remaining POR initialization operations based on the repaired firmware. Exemplary remaining POR initialization operations include, for example, a register initialization operation to initialize registers 414, an internal ZQ calibration operation, and a temperature sensor initialization operation.

According to one aspect of the present disclosure, a memory device includes a non-volatile memory storing firmware, a control logic coupled to the non-volatile memory, and an array of memory cells coupled to the control logic, the array of memory cells is embedded with instructions that are executable by the control logic. The control logic is configured to perform a power-on reset (POR) initialization operation to control an initialization of the memory device based on the firmware, repair the firmware based on execution of the instructions embedded on the array of memory cells, and perform a remaining POR initialization operation based on the repaired firmware.

In some implementations, the control logic is configured to access the array of memory cells during the initialization of the memory device and receive the instructions embedded on the array of the memory cells for execution.

In some implementations, the control logic is configured to generate optimized firmware codes based on the execution of the instructions.

In some implementations, the control logic is configured to repair the firmware by updating at least a portion of the firmware using the optimized firmware codes.

In some implementations, updating at least a portion of the firmware includes at least one of adding a new segment to the firmware, deleting an existing segment of the firmware, or replacing one or more segments of the firmware with a different segment.

In some implementations, the POR initialization operation includes a bad block reset operation.

In some implementations, the POR initialization operation includes a bad column repair operation.

In some implementations, the remaining POR initialization operation includes a register initialization operation.

In some implementations, the remaining POR initialization operation includes an internal ZQ calibration operation.

In some implementations, the remaining POR initialization operation includes a temperature sensor initialization operation.

In some implementations, the non-volatile memory includes a programmable read-only memory.

In some implementations, the memory device includes a three-dimensional (3D) NAND memory device.

According to another aspect of the present disclosure, a system includes a memory device configured to store data and a memory controller coupled to the memory device and configured to control the memory device. The memory device includes a non-volatile memory storing firmware, a control logic coupled to the non-volatile memory, and an array of memory cells coupled to the control logic, the array of memory cells is embedded with instructions that are executable by the control logic. The control logic is configured to perform a power-on reset (POR) initialization operation to control an initialization of the memory device based on the firmware, repair the firmware based on execution of the instructions embedded on the array of memory cells, and perform a remaining POR initialization operation based on the repaired firmware.

In some implementations, the system includes a host coupled to the memory controller and configured to send or receive the data.

In some implementations, the control logic is configured to access the array of memory cells during the initialization of the memory device and receive the instructions embedded on the array of the memory cells for execution.

In some implementations, the control logic is configured to generate optimized firmware codes based on the execution of the instructions.

In some implementations, the control logic is configured to repair the firmware by updating at least a portion of the firmware using the optimized firmware codes.

In some implementations, updating at least a portion of the firmware includes at least one of adding a new segment to the firmware, deleting an existing segment of the firmware, or replacing one or more segments of the firmware with a different segment.

In some implementations, the POR initialization operation includes a bad block reset operation.

In some implementations, the POR initialization operation includes a bad column repair operation.

In some implementations, the remaining POR initialization operation includes a register initialization operation.

In some implementations, the remaining POR initialization operation includes an internal ZQ calibration operation.

In some implementations, the remaining POR initialization operation includes a temperature sensor initialization operation.

In some implementations, the non-volatile memory includes a programmable read-only memory.

In some implementations, the memory device includes a three-dimensional (3D) NAND memory device.

According to still another aspect of the present disclosure, a method for initializing a memory device is provided. The memory device includes a non-volatile memory storing firmware, a control logic coupled to the non-volatile memory, and an array of memory cells coupled to the control logic and embedded with instructions for repairing the firmware. The method includes performing, by the control logic, at least one power-on reset (POR) initialization operation; repairing, by the control logic, the firmware based on execution of the instructions embedded on the array of memory cells; and performing, by the control logic, one or more remaining POR initialization operations based on the repaired firmware.

In some implementations, the method includes accessing, by the control logic, the array of memory cells; and receiving, by the control logic, the instructions embedded on the array of the memory cells for execution.

In some implementations, the method includes generating optimized firmware codes based on the execution of the instructions.

In some implementations, the method includes repairing the firmware by updating at least a portion of the firmware using the optimized firmware codes.

In some implementations, updating at least a portion of the firmware includes at least one of adding a new segment to the firmware, deleting an existing segment of the firmware, or replacing one or more segments of the firmware with a different segment.

In some implementations, performing the POR initialization operation includes performing a bad block reset operation.

In some implementations, performing the POR initialization operation includes performing a bad column repair operation.

In some implementations, performing the remaining POR initialization operation includes performing a register initialization operation.

In some implementations, performing the remaining POR initialization operation includes performing an internal ZQ calibration operation.

In some implementations, performing the remaining POR initialization operation includes performing a temperature sensor initialization operation.

The foregoing description of the specific implementations can be readily modified and/or adapted for various applications. Therefore, such adaptations and modifications are intended to be within the meaning and range of equivalents of the disclosed implementations, based on the teaching and guidance presented herein.

The breadth and scope of the present disclosure should not be limited by any of the above-described exemplary implementations, but should be defined only in accordance with the following claims and their equivalents.

What is claimed is:

1. A memory device, comprising:
a non-volatile memory storing firmware;
a control logic coupled to the non-volatile memory; and
an array of memory cells coupled to the control logic, the array of memory cells is embedded with firmware repairing instructions that are executable by the control logic;
wherein the control logic is configured to:
perform an early stage of a power-on reset (POR) initialization operation to control an initialization of the memory device based on the firmware;
repair the firmware based on execution of the firmware repairing instructions embedded on the array of memory cells during the POR initialization operation; and
perform a remaining stage of the POR initialization operation to further control the initialization of the memory device based on the repaired firmware.

2. The memory device of claim 1, wherein the control logic is configured to:
read addresses of the firmware repairing instructions from the non-volatile memory;
access the array of memory cells during the initialization of the memory device based on addresses; and
receive the firmware repairing instructions embedded on the array of the memory cells for execution.

3. The memory device of claim 1, wherein the control logic is configured to:
generate optimized firmware codes based on the execution of the firmware repairing instructions.

4. The memory device of claim 3, wherein the control logic is configured to:
repair the firmware by updating at least a portion of the firmware using the optimized firmware codes.

5. The memory device of claim 4, wherein updating at least a portion of the firmware comprises at least one of adding a new segment to the firmware, deleting an existing segment of the firmware, or replacing one or more segments of the firmware with a different segment.

6. The memory device of claim 1, wherein the early stage of the POR initialization operation comprises a bad block reset operation.

7. The memory device of claim 1, wherein the early stage of the POR initialization operation comprises a bad column repair operation.

8. The memory device of claim 1, wherein the remaining stage of the POR initialization operation comprises a register initialization operation.

9. The memory device of claim 1, wherein the remaining stage of the POR initialization operation comprises an internal ZQ calibration operation.

10. The memory device of claim 1, wherein the remaining stage of the POR initialization operation comprises a temperature sensor initialization operation.

11. The memory device of claim 1, wherein the non-volatile memory comprises a programmable read-only memory.

12. The memory device of claim 1, wherein the memory device comprises a three-dimensional (3D) NAND memory device.

13. A system, comprising:
a memory device configured to store data, the memory device comprising:
a non-volatile memory storing firmware;
a control logic coupled to the non-volatile memory; and
an array of memory cells coupled to the control logic, the array of memory cells is embedded with firmware repairing instructions that are executable by the control logic;
wherein the control logic is configured to:
perform an early stage of a power-on reset (POR) initialization operation to control an initialization of the memory device based on the firmware;
repair the firmware based on execution of the firmware repairing instructions embedded on the array of memory cells during the POR initialization operation; and perform a remaining stage of the POR initialization operation to further control the initialization of the memory device based on the repaired firmware; and a memory controller coupled to the memory device and configured to control the memory device.

14. A method for initializing a memory device, the memory device comprising a non-volatile memory storing firmware, a control logic coupled to the non-volatile memory, and an array of memory cells coupled to the control logic and embedded with firmware repairing instructions for repairing the firmware, the method comprising:

performing, by the control logic, a power-on reset (POR) initialization operation;

repairing, by the control logic, the firmware based on execution of the firmware repairing instructions embedded on the array of memory cells during the POR initialization operation; and performing, by the control logic, a remaining stage of the POR initialization operation to further control the initialization of the memory device based on the repaired firmware.

15. The method of claim 14, further comprising:

reading, by the control logic from the non-volatile memory, addresses of the firmware repairing instructions;

accessing, by the control logic, the array of memory cells based on the addresses; and receiving, by the control logic, the firmware repairing instructions embedded on the array of the memory cells for execution.

16. The method of claim 14, further comprising:

generating optimized firmware codes based on the execution of the firmware repairing instructions.

17. The method of claim 16, further comprising:

repairing the firmware by updating at least a portion of the firmware using the optimized firmware codes.

18. The method of claim 17, wherein updating at least a portion of the firmware comprises at least one of adding a new segment to the firmware, deleting an existing segment of the firmware, or replacing one or more segments of the firmware with a different segment.

19. The method of claim 14, wherein performing the early stage of the POR initialization operation comprises performing a bad block reset operation or a bad column repair operation.

20. The method of claim 14, wherein performing the remaining stage of the POR initialization operation comprises performing at least one of a register initialization operation, an internal ZQ calibration operation, or a temperature sensor initialization operation.

* * * * *